(12) United States Patent
Hasegawa et al.

(10) Patent No.: US 6,346,862 B2
(45) Date of Patent: *Feb. 12, 2002

(54) QUARTZ OSCILLATION CIRCUIT AND QUARTZ OSCILLATION INTEGRATED CIRCUIT DEVICE (75) Inventors: Eiichi Hasegawa; Haruhiko Otsuka, both of Tokyo (JP)

(73) Assignee: Nippon Precision Circuits, Inc., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,295

(22) Filed: Mar. 5, 1999

(30) Foreign Application Priority Data

Mar. 6, 1998 (JP) .......................................... 10-055011

(51) Int. Cl.[7] .............................. H03B 5/32; H03B 5/36; H03L 1/00
(52) U.S. Cl. ..................... 331/158; 331/116 R; 331/175
(58) Field of Search ........................... 331/158, 116 FE, 331/116 R, 175

(56) References Cited

U.S. PATENT DOCUMENTS

| 4,896,122 A | 1/1990 | Tahernia et al. ............. 331/158 |
| 5,745,012 A | * 4/1998 | Oka et al. ..................... 331/68 |

* cited by examiner

Primary Examiner—Robert Pascal
Assistant Examiner—Kimberly E Glenn
(74) Attorney, Agent, or Firm—Schulte Roth & Zabel; Donna Angotti; Joel Lutzker

(57) ABSTRACT

In a quartz oscillation circuit, electric current flowing through a quartz oscillator is reduced. Resistors Rg and Rd are provided respectively in any of paths formed by an output terminal, a capacitance element Cd and a power supply terminal VDD of a CMOS inverter 2 and any of paths formed by an input terminal, a capacitance element Cg and a power supply terminal VDD, thereby reducing a current flowing through a quartz oscillator. In particular, the total value of the resistors Rd and Rg is determined in a range of from 10Ω to 320Ω, thereby reducing a quartz current and obtaining a required negative resistance.

10 Claims, 8 Drawing Sheets

| | Rg [Ω] | Rd [Ω] | Rg+Rd [Ω] | Cg [pF] | Cd [pF] | −RL[Ω] 70[MHz] | −RL[Ω] 100[MHz] | X'tal[mA] 70[MHz] | X'tal[mA] 100[MHz] |
|---|---|---|---|---|---|---|---|---|---|
| 101 | 0 | 0 | 0 | 8 | 16 | −569.0 | −266.1 | 21.9 | 33.8 |
| 102 | 15 | 15 | 30 | 8 | 16 | −531.1 | −250.6 | 20.7 | 29.9 |
| 103 | 20 | 20 | 40 | 8 | 16 | −531.2 | −249.0 | 18.5 | 28.5 |
| 104 | 30 | 30 | 60 | 8 | 16 | −523.5 | −243.3 | 17.5 | 24.5 |
| 105 | 40 | 40 | 80 | 8 | 16 | −505.3 | −239.8 | 16.3 | 22.7 |
| 106 | 60 | 60 | 120 | 8 | 16 | −452.2 | −219.5 | 13.7 | 18.4 |
| 107 | 20 | 0 | 20 | 8 | 16 | −552.5 | −259.0 | 19.8 | 31.1 |
| 108 | 60 | 0 | 60 | 8 | 16 | −521.1 | −245.5 | 15.1 | 24.7 |
| 109 | 0 | 20 | 20 | 8 | 16 | −549.6 | −259.2 | 18.4 | 32.1 |
| 110 | 0 | 60 | 60 | 8 | 16 | −505.5 | −246.8 | 15.6 | 24.3 |
| MD | | | | 8 | 15 | −438.2 | −197.7 | 23.7 | 34.1 |
| NG | | | | 10 | 10 | −271.6 | −120.2 | 20.0 | 27.7 |

| | Rg [Ω] | Rd [Ω] | Rg+Rd [Ω] | Cg [pF] | Cd [pF] | −RL[Ω] 70[MHz] | −RL[Ω] 100[MHz] | X'tal[mA] 70[MHz] | X'tal[mA] 100[MHz] |
|---|---|---|---|---|---|---|---|---|---|
| 201 | 0 | 0 | 0 | 8 | 16 | −566.4 | −266.4 | 19.9 | 34.4 |
| 202 | 15 | 15 | 30 | 8 | 16 | −560.0 | −261.4 | 18.5 | 32.8 |
| 203 | 20 | 20 | 40 | 8 | 16 | −541.8 | −254.2 | 18.3 | 30.8 |
| 204 | 30 | 30 | 60 | 8 | 16 | −532.3 | −250.0 | 17.4 | 28.9 |
| 205 | 40 | 40 | 80 | 8 | 16 | −511.9 | −241.3 | 16.5 | 25.7 |
| 206 | 60 | 60 | 120 | 8 | 16 | −459.6 | −217.5 | 14.7 | 21.8 |
| 207 | 20 | 0 | 20 | 8 | 16 | −563.2 | −263.3 | 19 | 31.5 |
| 208 | 60 | 0 | 60 | 8 | 16 | −530.2 | −246.3 | 16.8 | 27.7 |
| 209 | 0 | 20 | 20 | 8 | 16 | −554.8 | −261.9 | 19.2 | 30.2 |
| 210 | 0 | 60 | 60 | 8 | 16 | −532.2 | −250.0 | 16.6 | 27.5 |

… 
QUARTZ OSCILLATION CIRCUIT AND QUARTZ OSCILLATION INTEGRATED CIRCUIT DEVICE

BACKGROUND OF THE INVENTION

1. Field of the Invention

The present invention relates to a quartz oscillation circuit and quartz oscillation integrated circuit device.

2. Description of the Related Art

Figure 10:
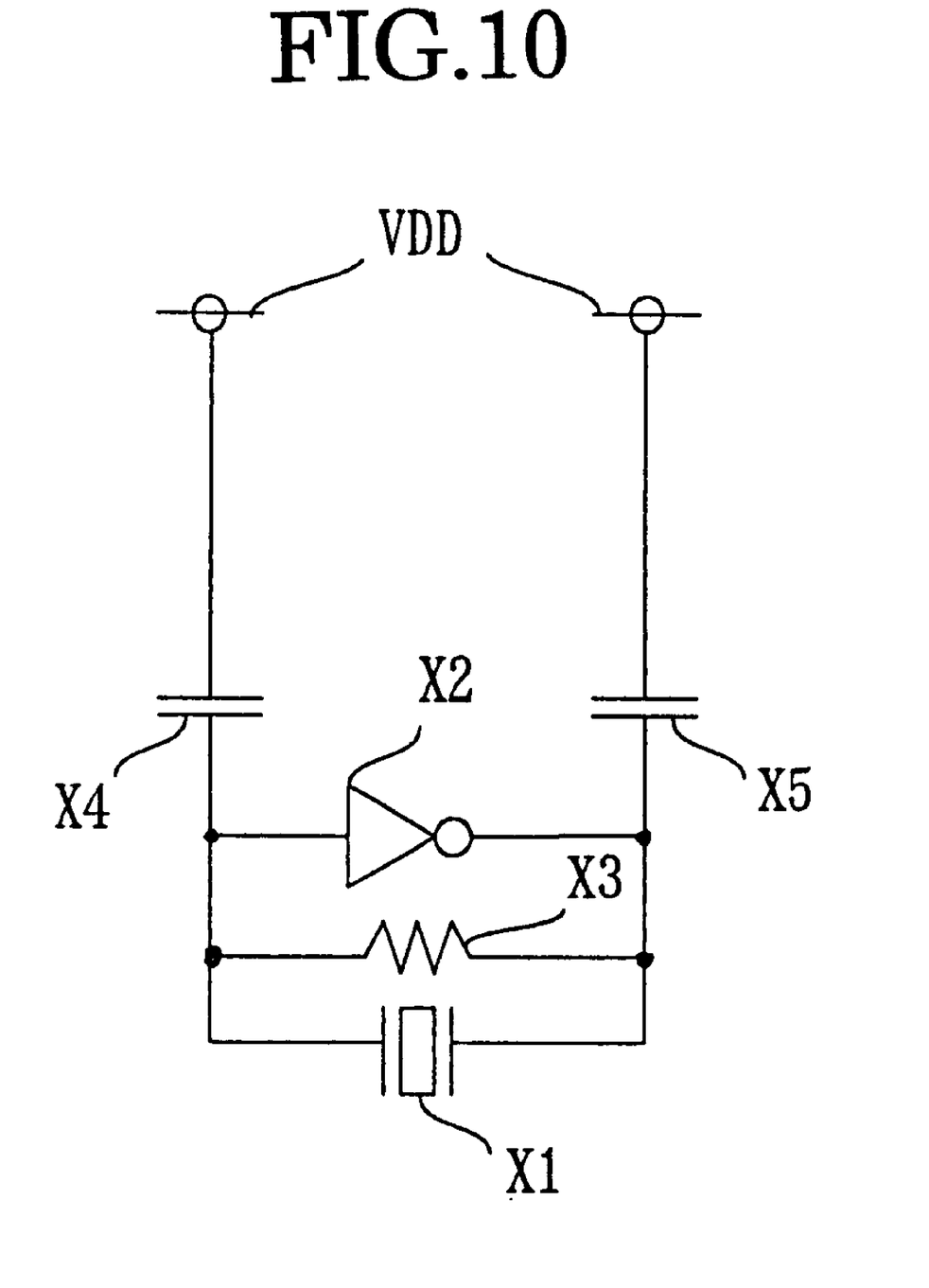
FIG. 10 is an explanatory view for explaining a configuration of a conventional quartz oscillation circuit.

The conventional CMOS oscillation circuit is formed, as shown in FIG. 10, by a quartz oscillator X1 connected between input and output terminals of a CMOS inverter X2, and a feedback resistor X3 connected between these input and output terminals. Furthermore, these input terminal and output terminal are respectively connected through capacitance elements X4 and X5 to a power supply VSS (0 V).

Recently, in such oscillation circuits miniaturization in quartz oscillator has been advanced due to a requirement to reduce overall quartz oscillation module sizes and increase operation frequency speeds. However, it becomes impossible to think light of the problem of quartz current (current flowing through quartz upon oscillation) caused by reducing the size in the quartz oscillator. For example, increased amplitude due to excessive quartz current induces frequency instability, leading to breakage of the quartz oscillator in a worst case.

Figure 11:
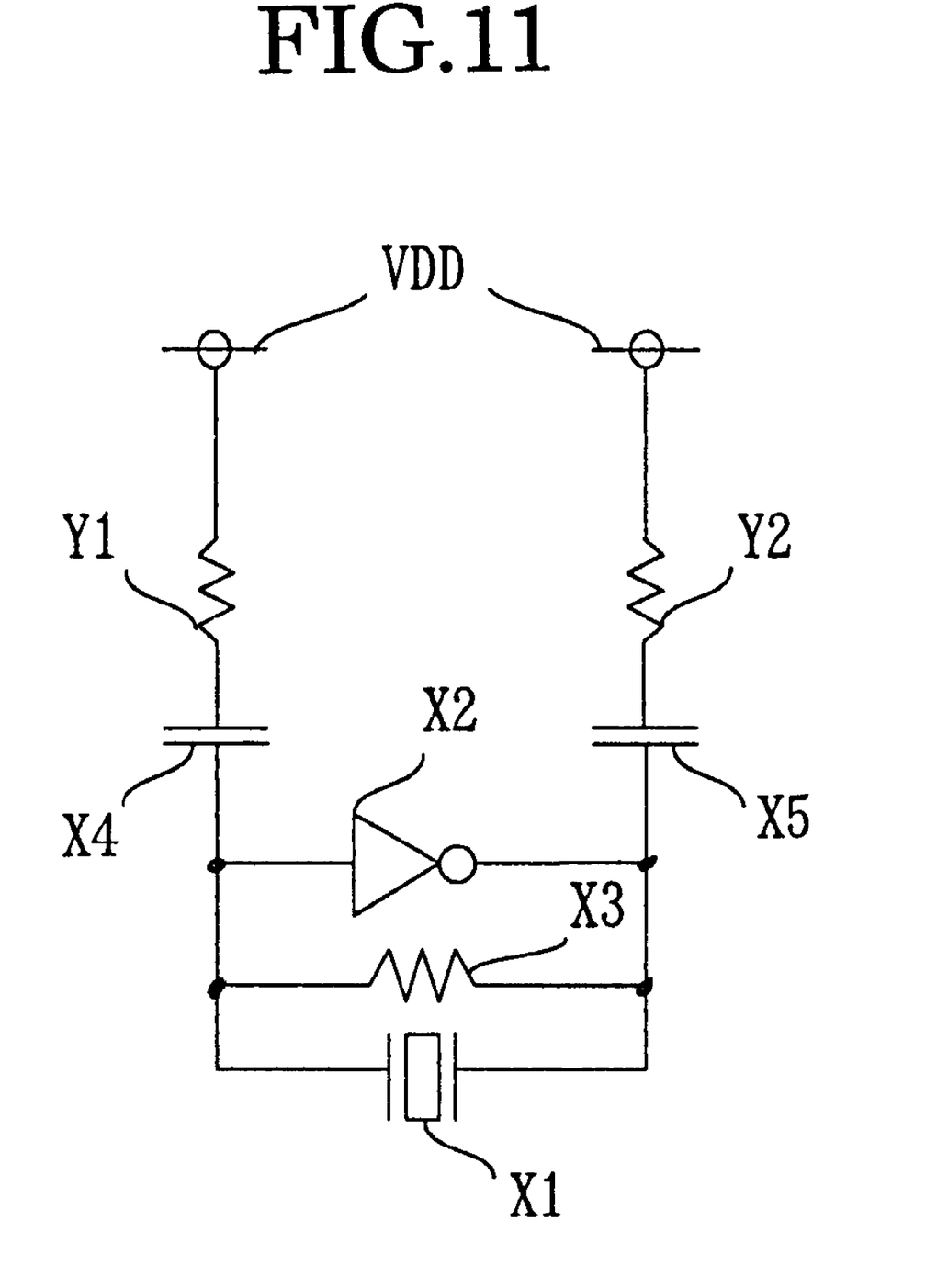
FIG. 11 is an explanation view for explaining a configuration of a quartz oscillation circuit allowing to reduce a quartz current.

In an attempt to solve such a problem, there is filed an patent application as Japanese Patent Application No. H9-5765 ("Quartz Oscillation Circuit and Quartz Oscillation Integrated Circuit Device") published Aug. 7, 1998 and corresponding to U.S. patent application Ser. No. 09/004,686, filed Jan. 8, 1998 by the present applicant and inventor. This is provided, for example as shown in FIG. 11, with a resistor Y1 between a capacitance element X4 and a power supply terminal VDD, and a resistor Y2 between a capacitance element X5 and the power supply terminal VDD, in order to reduce a quartz current.

It has been discussed in the earlier patent application that the value of the resistance Y1, Y2 is preferably determined from a balance between a negative resistance and a quartz current. However, there has been a desire to concretely determine an optimum range.

SUMMARY OF THE INVENTION

The present invention has obtained an optimum range as desired above through further studies conducted after filing the earlier patent application.

The present invention has determined a sum of values of resistances provided between a CMOS inverter input terminal and power supply terminal and/or between an output terminal and power supply terminal in a range of from $10\Omega$ to $320\Omega$.

A quartz oscillation circuit according to the present invention comprises: a CMOS inverter; a quartz oscillator connected between input and output terminals of the CMOS inverter; a feedback resistor connected between the input and output terminals of the CMOS inverter; a first capacitance element provided between a first connection point of the input terminal of the CMOS inverter and the quartz oscillator and a power supply terminal having a particular potential; a second capacitance element provided between a second connection point of the output terminal of the CMOS inverter and the quartz oscillator and the particular potential power supply terminal; and resistors provided at any one or a plurality of points of between the first connection point and the first capacitance element, between the second connection point and the second capacitance element and between the second capacitance element and the power supply terminal; wherein a sum of resistance values of the resistors lies in a range of from $10\Omega$ to $320\Omega$.

A quartz oscillation integrated circuit device according to the present invention comprises: a CMOS inverter; terminals for connecting a quartz oscillator between input and output terminals of the CMOS inverter; a feedback resistor connected between the input and output terminals of the CMOS inverter; a first capacitance element provided between a first connection point of the input terminal of the CMOS inverter and the quartz oscillator and a power supply terminal having a particular potential; a second capacitance element provided between a second connection point of the output terminal of the CMOS inverter and the quartz oscillator and the particular potential power supply terminal; and resistors provided at any one or a plurality of points of between the first connection point and the first capacitance element, between the second connection point and the second capacitance element and between the second capacitance element and the power supply terminal; wherein a sum of resistance values of the resistors lies in a range of from $10\Omega$ to $320\Omega$.

DETAILED DESCRIPTION OF THE PREFERRED EMBODIMENTS

Embodiments

Figure 1:
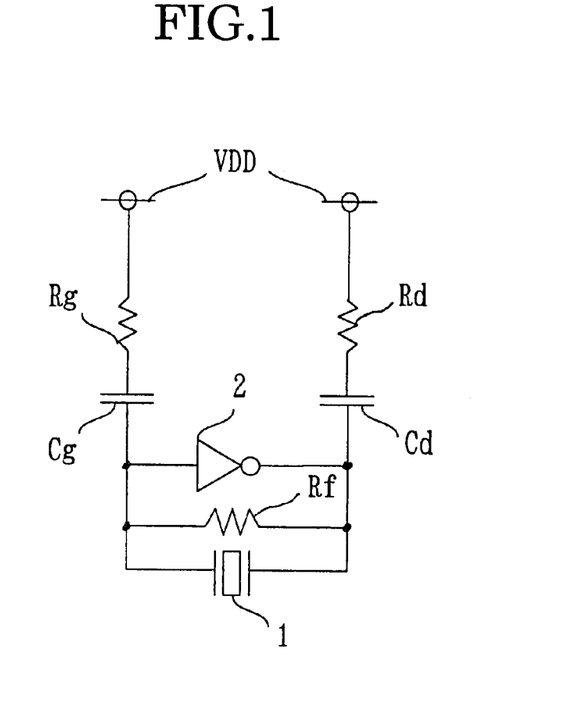
FIG. 1 is an explanatory view for explaining a configuration of a quartz oscillation circuit according to one embodiment of the present invention.

Now explanation will be made on a quartz oscillator according to one embodiment of the present invention. FIG. 1 is an electrical circuit diagram showing a structure of this embodiment. In the figure, 1 is a quartz oscillator, and 2 is a CMOS inverter. The quartz oscillator 1 is externally connected between input and output terminals of the CMOS inverter 2 of an integrated circuit (not shown) integrated with the CMOS inverter 2. Rf is a feedback resistor connected between the input and output terminals of the CMOS inverter 2. Cg and Cd are capacitance elements. Each of the capacitance elements Cg, Cd is connected between the input and output terminals of the CMOS inverter 2. Rg and Rd are resistors. The resistor Rg is connected between the capacitance element Cg and a power supply terminal VDD (5.0 V), while the resistor Rd is connected between the capacitance element Cd and the power terminal VDD (5.0 V). Here, the CMOS inverter 2 employs a Mo (molybdenum) gate, and is low in gate capacitance and resistance as compared with one using a Poly-Si (polysilicon) gate. It can be considered that the CMOS inverter 2 is connected with only net capacitance and resistance of the capacitance elements Cg, Cd and the resistors Rg, Rd.

Now explanation will be made on characteristics of the quarts oscillation circuit of the present embodiment.

Figure 2:
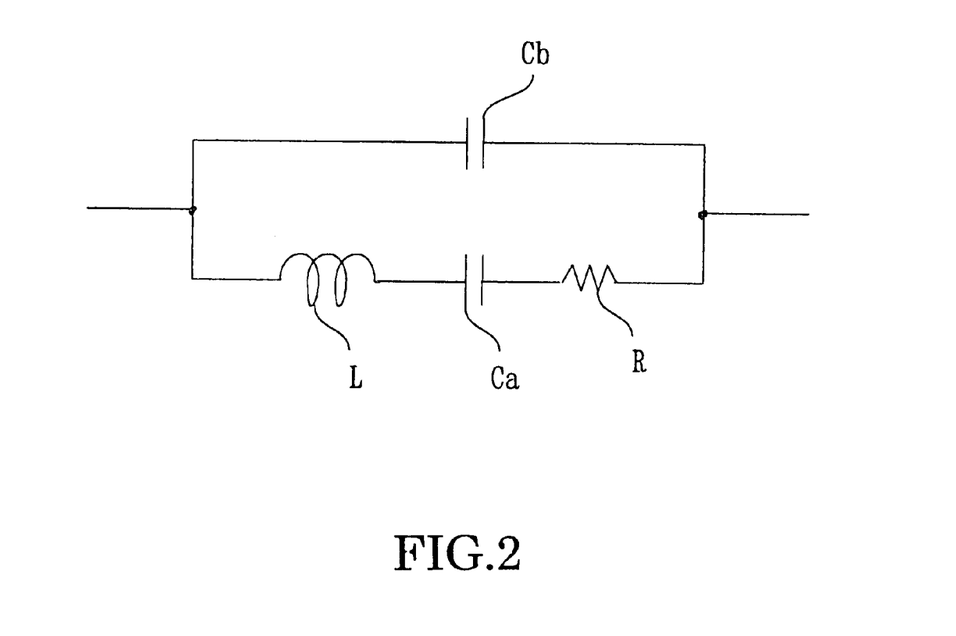
FIG. 2 is an explanatory view for explaining an essential part of FIG. 1.

The quartz oscillator 1 is for those with basic frequencies of 70 MHz and 100 MHz both of which can be represented by an equivalent circuit of FIG. 2. In the figure, it is assumed that the circuit for 70 MHz application has a capacitance Ca value of approximately 2.07861 fF, a capacitance Cb value of approximately 6.37687 pF, a resistance R value of approximately 13.9976Ω, and an inductance L value of approximately 2.48692 mH. On the other hand, the circuit for 100 MHz application is assumed to have a capacitance Ca value of approximately 691.688 aF, a capacitance Cb value of approximately 5.00331 pF, a resistance R value of approximately 20.8419Ω, and an inductance L value of approximately 3.66203 mH.

Figure 3:
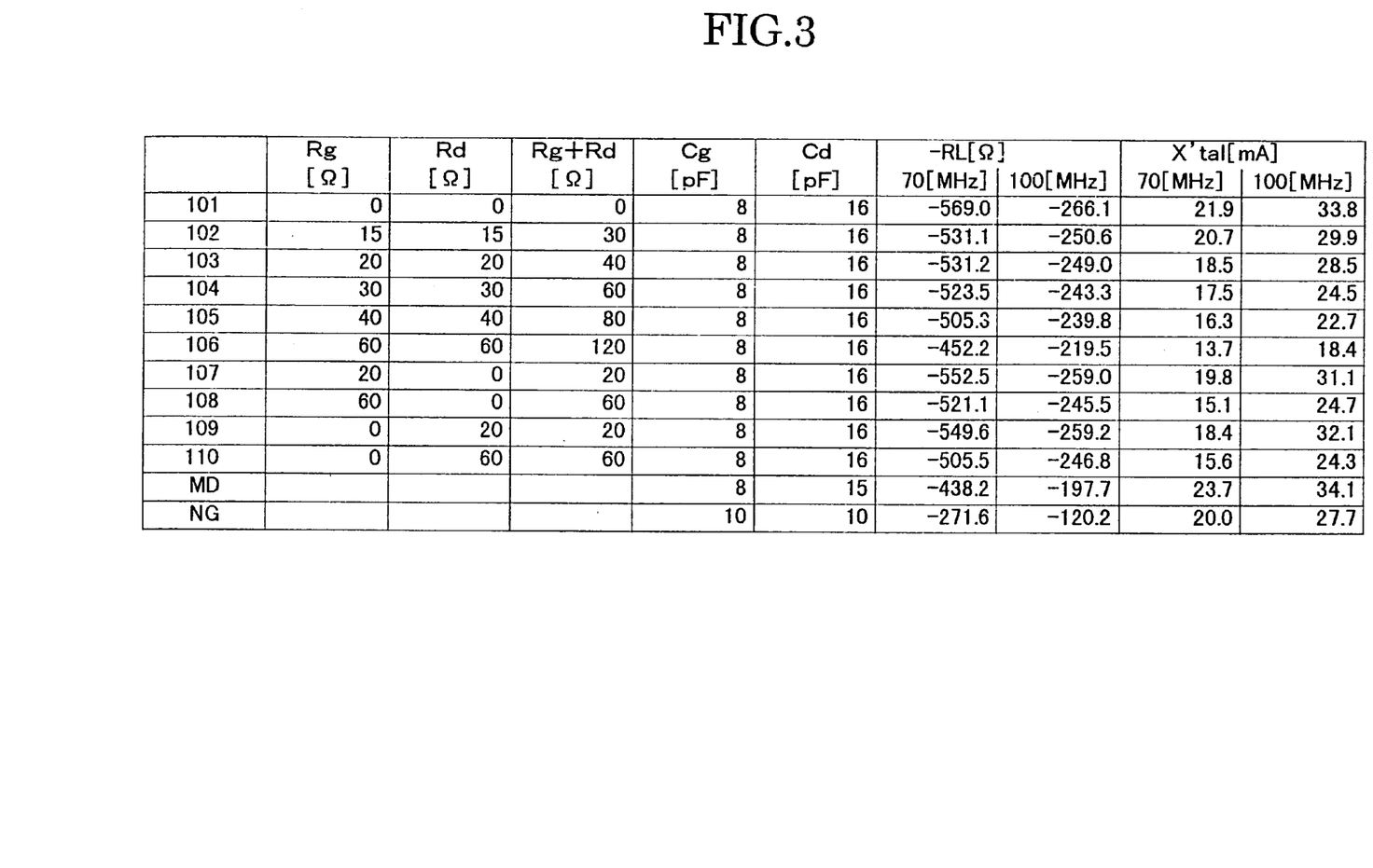
FIG. 3 is an explanatory view for explaining a characteristic of the quartz oscillation circuit of the one embodiment.

FIG. 3 demonstrates a result of measurement for quartz current and negative resistance on samples of quartz oscillation integrated circuits 101–110 having different values of resistances Rg, Rd and capacitance elements Cg, Cd. Here, the CMOS inverter 2 is configured by using a P-channel MOS transistor with a gate width of 1376 μm and an N-channel MOS transistor with a gate width of 500.8 μm. Also, each resistor Rg, Rd employs a TFR (Thin Film Resistor). The capacitance elements Cg, Cd each use Poly-Si in one pole and Mo in the other pole.

The samples 101–106 have resistors Rg, Rd having a same resistance value Rg, Rd varied therefor. Also, the capacitance elements Cg, Cd have respective values 8 pF and 16 pF commonly applied to the samples. Also, although not especially shown in FIG. 3, the value of the feedback resistance Rf is 2.7 kΩ for each sample. Meanwhile, showings are given on measurements for quartz current and negative resistance on samples 107, 108 having only the resistor Rg having respective values of 20Ω and 60Ω as well as samples 109, 110 having only the resistor Rd having respective values of 20Ω and 60Ω.

Figure 4:
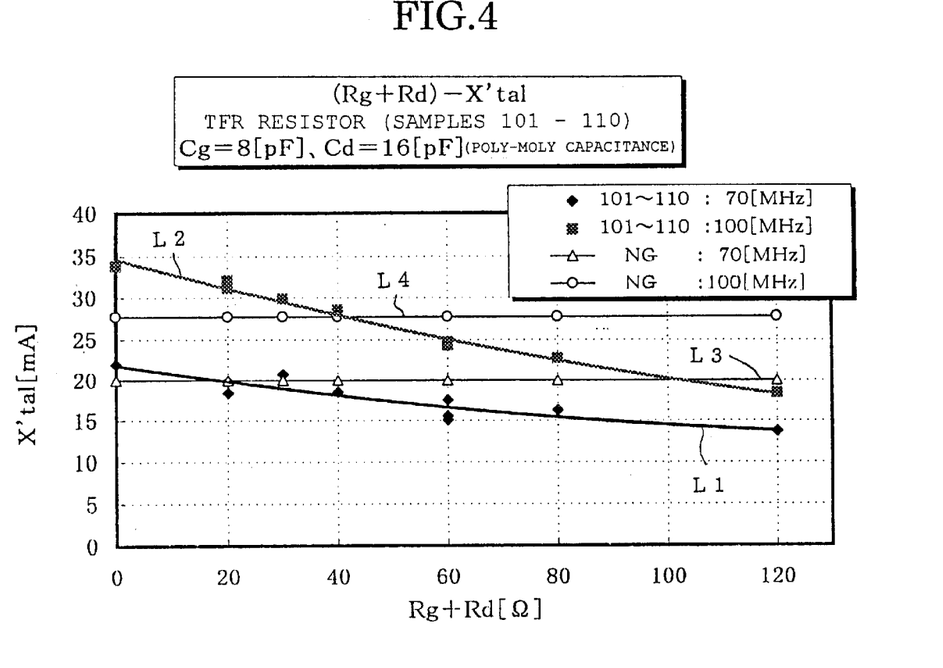
FIG. 4 is an explanatory view for explaining a characteristic of the quartz oscillation circuit of the one embodiment.

Now, in the measurement result of FIG. 3, the resistance value Rg and Rd are added together for the samples 101–110 to obtain Rg+Rd for convenience with a quartz current for each case given as X' tal, showing concrete values. This provides a relationship between a value Rg+Rd and a quartz current X' tal as shown in FIG. 4. In the figure, lines L1 and L2 are respectively obtained from the quartz currents measured by oscillating the samples 101–110 at 70 MHz and 100 MHz. As will be understood from the figure, the relationship between the value Rg+Rd having added together the resistance values Rg and Rd and the quartz current X' tal follows the line L1, L2 regardless of providing any of the resistances Rg and Rd. The quartz current X' tal decreases with increase in the value Rg+Rd. Also, the quartz current X' tal increases with increase in the oscillation frequency. Meanwhile, lines L3 and L4 respectively represents quartz currents obtained by oscillating a conventional quartz-oscillation integrated circuit sample NG at 70 MHz and 100 MHz. The sample NG, although not shown, is not provided with resistors Rg, Rd but uses P-channel and N-channel MOS transistors constituting an inverter respectively having gate widths of 1800 μm and 900 μm. Also, capacitance elements Cg, Cd are employed both having a capacitance value of 10 pF, wherein A1 is used for one pole and Mo for the other pole. The sample NG is one example which exhibits a nearly maximum quartz current to drive without damaging the quartz oscillator. It was however confirmed that the quartz current for the sample NG oscillated at 100 MHz has a somewhat margin against damaging the quartz oscillator. In an empirical confirmation, the frequency of damaging the quartz oscillator increases from a quartz current of 30 mA. It was confirmed from this that the value Rg+Rd are preferably given 10Ω or greater. Also, if the above margin is given against quartz oscillator damage, it may be nearly the quartz current for the sample NG with the value Rg+Rd preferably determined at 40Ω or greater.

Figure 5:
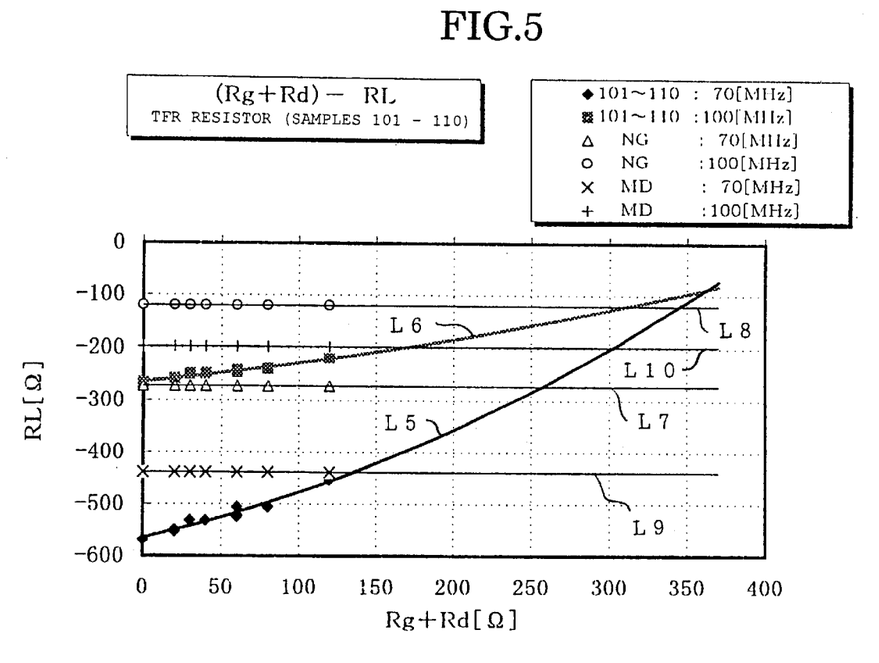
FIG. 5 is an explanatory view for explaining a characteristic of the quartz oscillation circuit of the one embodiment.

Meanwhile, the negative resistance is shown as RL for convenience in FIG. 3. From this, the relationship between the value Rg+Rd and the negative resistance RL for the samples 101–110 is given as shown in FIG. 5. In the figure, lines L5 and L6 are respectively obtained from the negative resistances RL measured by oscillating the sample 101–110 at 70 MHz and 100 MHz. As will be understood from the figure, the relationship between the value Rg+Rd having added together the resistance values Rg and Rd and the negative resistance RL follows the line L5, L6 regardless of providing any of the resistors Rg and Rd. That is, the negative resistance RL can be determined greater as the value Rg+Rd decreases (Incidentally, in FIG. 5 −RL is shown wherein the value −RL decreases with decrease in the value Rg+Rd if considering the reading of the graph). Incidentally, the negative resistance has to be determined somewhat greater from a view point of oscillation startability and stability. For example, the lines L7 and L8 respectively represent −RL for the sample NG oscillated at 70 MHz and 100 MHz. The sample NG has a minimum negative resistance that may cause a problem on oscillation startability and stability. That is, if the value of the negative resistance RL be smaller than this, concretely if the value −RL is greater than −200Ω, the oscillation startability and stability become worse. Also, lines L9 and L10 respectively show −RL for a conventional quartz oscillation integrated circuit sample MD oscillated at 70 MHz and 100 MHz. As for also the sample MD, resistors Rg, Rd are not provided but P-channel and N-channel MOS transistors constituting a CMOS inverter are used which respectively having gate widths of 1620 μm and 540 μm. Also, the capacitance values for the capacitance elements Cg and Cd are respectively 8 pF and 10 pF, wherein A1 is used for one pole and Mo for the other pole. The sample MD is one example to exhibit an appropriate negative resistance.

It will be understood from FIG. 5 that a minimum required negative resistance can be obtained if the value Rg+Rd has an upper limit of 320Ω given around an intersection between the lines L6 and L8. That is, it is preferred that the upper limit of the value Rg+Rd is 320Ω.

As will be understood from FIG. 5, if the value Rg+Rd is determined 320Ω or smaller around which the lines L6 and L8 intersect, it is possible to obtain a negative resistance minimally required for oscillation at 100 MHz as mentioned above. Similarly, if the value Rg+Rd is 260Ω or smaller around which the lines L5 and L7 intersect, it is possible to obtain a negative resistance minimally required for oscillation at 70 MHz. If the value Rg+Rd is 170Ω or smaller around which the lines L6 and L10 intersect, it is possible to obtain a negative resistance sufficient for oscillation at 100 MHz. If 140Ω or smaller around which the lines L5 and L9 intersect, it is possible to obtain a negative resistance sufficient for oscillation at 70 MHz. Particularly, where balancing these four conditions, the upper limit of the value Rg+Rd is preferably given 220Ω. Also, because the required negative resistance RL value decreases with increase in the oscillation frequency, it is possible to fully cope with an oscillation frequency of 100 MHz or higher if the upper limit of the value Rg+Rd is determined.

It can be understood from the above results that, if the value Rg+Rd as a sum of the resistance Rg and Rd is determined 10Ω–320Ω, a required negative resistance is obtained with the quartz current reduced. In particular, if the value Rg+Rd is determined 40Ω–220Ω, it is possible to obtain a quartz current having a sufficient margin against damage to the quartz oscillator with a sufficient negative resistance in realizing high oscillation startability and stability.

Figure 6:
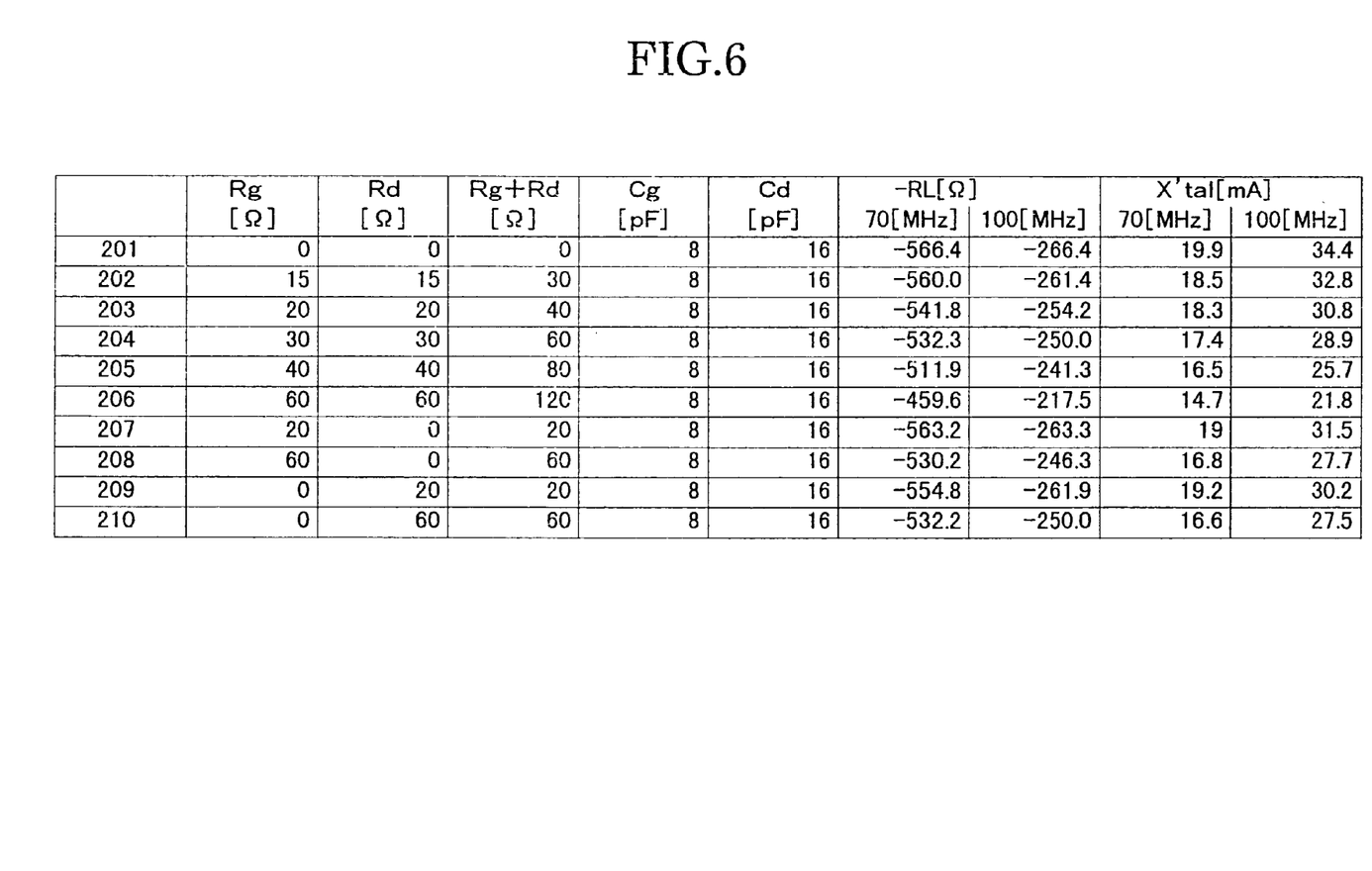
FIG. 6 is an explanatory view for explaining a characteristic of a quartz oscillation circuit of another embodiment.
Figure 7:
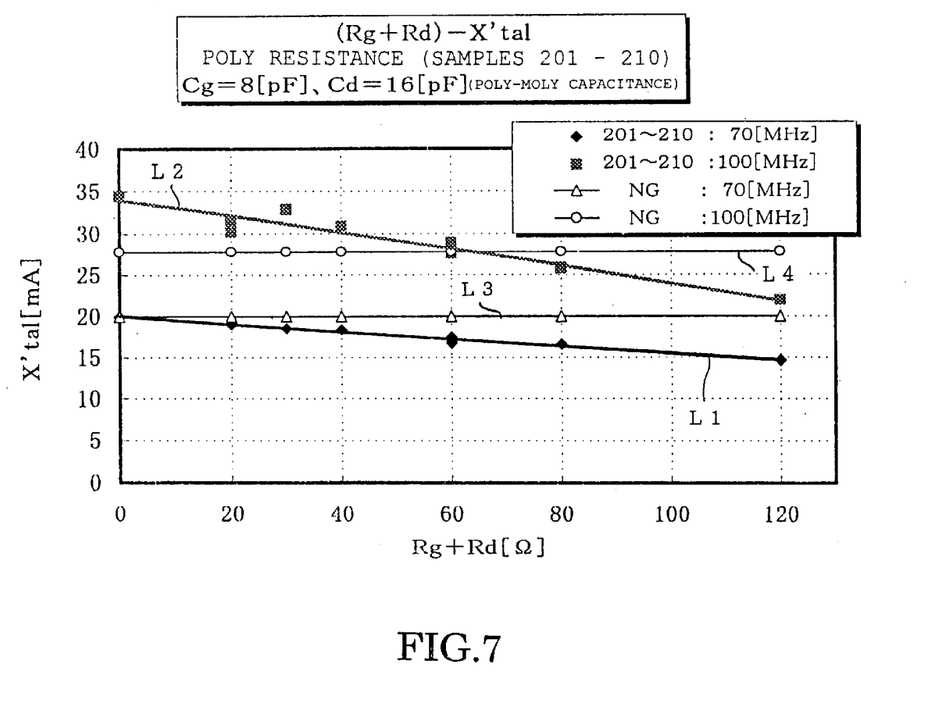
FIG. 7 is an explanatory view for explaining a characteristic of the quartz oscillation circuit of the other embodiment.
Figure 8:
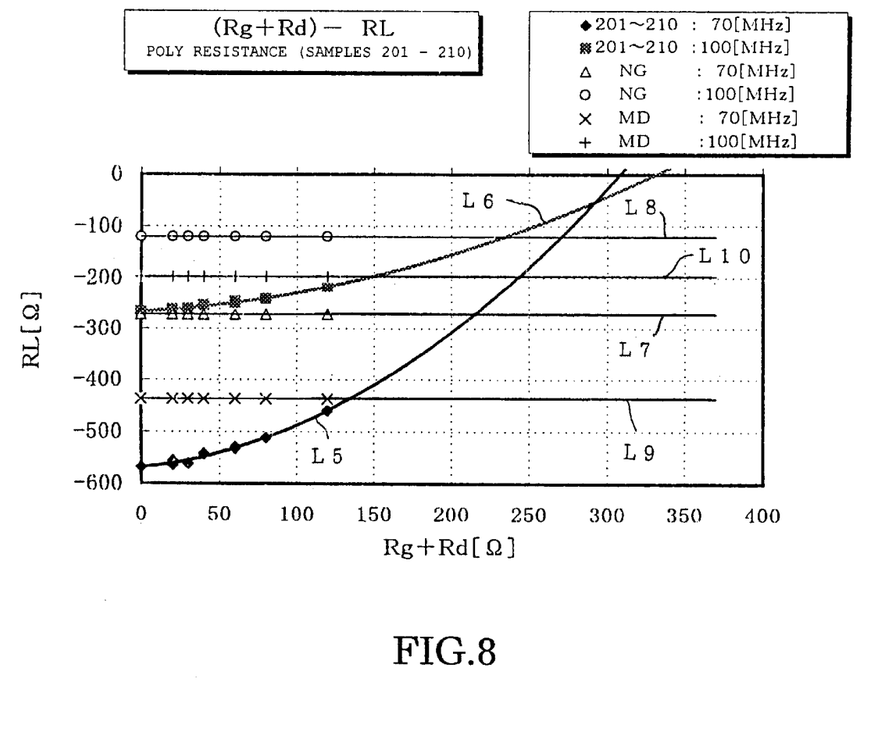
FIG. 8 is an explanatory view for explaining a characteristic of the quartz oscillation circuit of the other embodiment.

Although the above embodiment was explained by using the TFR for the resistor Rg, Rd, the present invention is not limited to such a structure but can be applied to a resistor formed of Poly-Si. Such a structure will be explained as another embodiment. In this example, the resistors Rg and Rd in the above-stated embodiment are replaced by Poly-Si resistors with other conditions determined the same. FIG. 6 demonstrates a result of measurement conducted similar to the above embodiment. Samples 201–210, on which measurement results are shown in FIG. 6, correspond to the samples 101–110. For these samples, there is shown in FIG. 7 a relationship between a value Rg+Rd having added together the resistances Rg and Rd and a quartz current X' tal. In FIG. 8 is shown a relationship between the value R+Rd and a negative resistance RL. Note that in FIGS. 7 and 8 the lines corresponding to those in FIGS. 4 and 5 are denoted by the same reference symbols for the sake of convenience. As will be understood from FIGS. 7 and 8, the cases using Poly-Si formed resistances also exhibit almost the same characteristics as those using TFRs as resistors. From this, a similar effect is obtainable if the value Rg+Rd is set in range as that of the above embodiment.

Incidentally, if comparing a case using TFRs for the resistors and a case with Poly-Si, the structure using the TFRs have reduced resistance value variation due to temperature. From such view points, the use of TFRs is preferred.

Incidentally, it is preferred that the values of the capacitance elements Cg and Cd are determined 8 pF–20 pF as stated in the former patent application. The feedback resistance Rf may be set in a range of 1 kΩ–5 kΩ.

Figure 9:
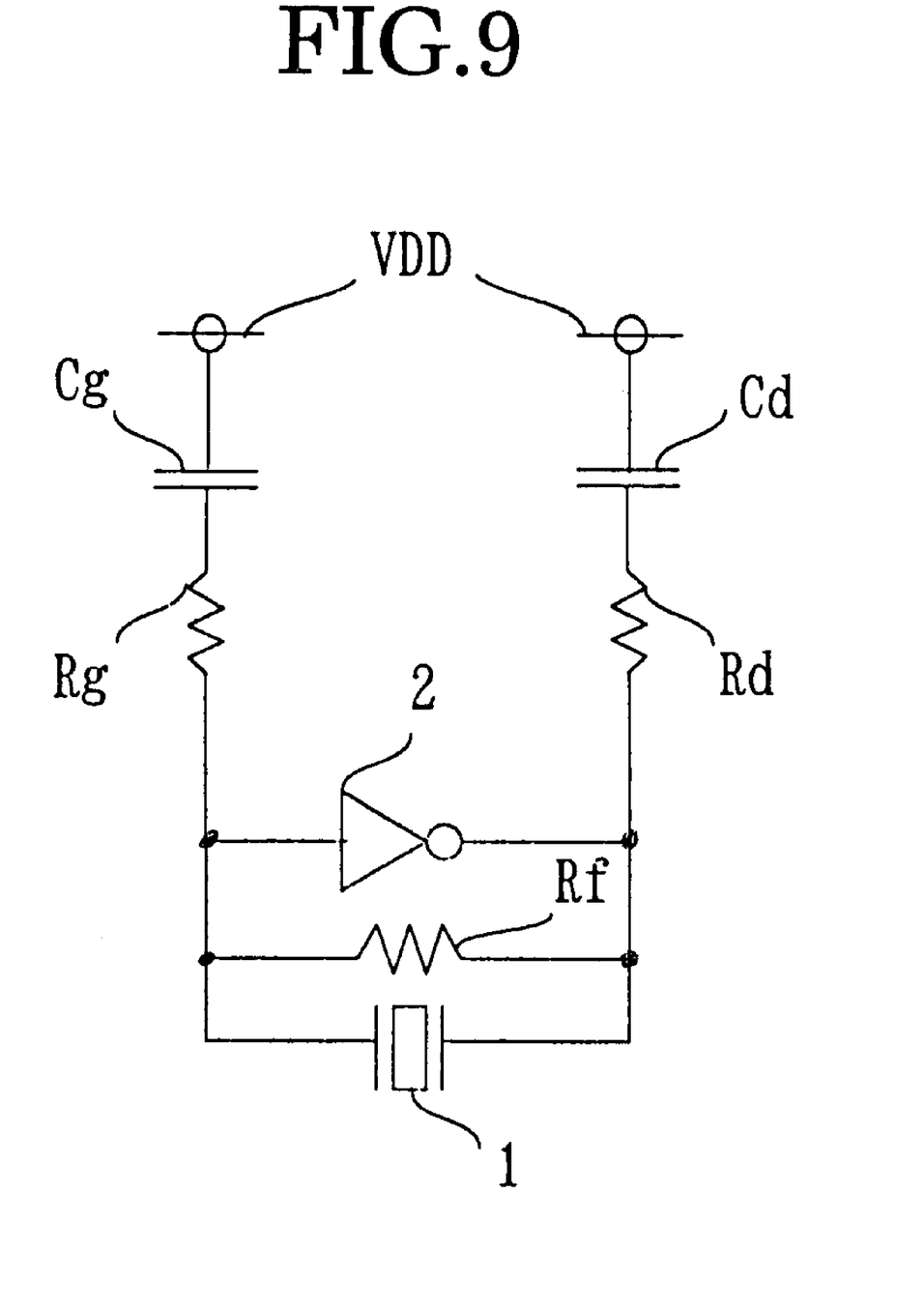
FIG. 9 is an explanatory view for explaining a configuration of a quartz oscillation circuit according to still another embodiment.

In the above embodiments, the resistors Rg and Rd were provided between the capacitance element Cg, Cd and the power supply terminal VDD. It is however possible, as stated in the former patent application, to provide the resistors Rg and Rd respectively between the capacitance element Cg and a connection point of a CMOS inverter 2 input terminal and the quartz oscillator 1 and between the capacitance element Cd and a connection point of a CMOS inverter 2 output terminal and the quartz oscillator 1, thereby reducing the quartz current. Also in such a case, a similar effect can be obtained by setting the value Rg+Rd in a range as that of the above one embodiment.

According to the preset invention, it is possible to reduce the quartz current with required negative resistance secured by determining, in a range of 10Ω to 320Ω, a sum in value of resistors provided between a CMOS inverter input terminal and a power supply terminal and/or an output terminal and the power supply terminal.

What is claimed is:

1. A quartz oscillation circuit having improved stability and performance comprising:

a CMOS inverter;

a quartz oscillator connected between input and output terminals of said CMOS inverter;

a feedback resistor connected between said input and output terminals of said CMOS inverter;

a first capacitance element provided between a first connection point of said input terminal of said CMOS inverter and said quartz oscillator and a power supply terminal having a particular potential;

a second capacitance element provided between a second connection point of said output terminal of said CMOS inverter and said quartz oscillator and said particular potential power supply terminal; and current limiting resistors having resistance values set for stability and startability of the quartz oscillation circuit while ensuring that there is no damage to a quartz crystal of the quartz oscillation circuit, said resistors provided at any one of a plurality of points of between said first connection point and said first capacitance element, between said first capacitance element and said power supply terminal; between said second connection point and said second capacitance element and between said second capacitance element and said power supply terminal to limit current provided to said quartz oscillator;

wherein a sum of said resistance values of said current limiting resistors lies in a range of from 10Ω to 320Ω.

2. A quartz oscillation integrated circuit having improved stability and performance device comprising:

a CMOS inverter;

terminals for connecting a quartz oscillator between input and output terminals of said CMOS inverter;

a feedback resistor connected between said input and output terminals of said CMOS inverter;

a first capacitance element provided between a first connection point of said input terminal of said CMOS inverter and said quartz oscillator and a power supply terminal having a particular potential;

a second capacitance element provided between a second connection point of said output terminal of said CMOS inverter and said quartz oscillator and said particular potential power supply terminal; and current limiting resistors having resistance values set for stability and startability of the quartz oscillation circuit while ensuring that there is no damage to a quartz crystal of the quartz oscillation circuit, said resistors provided at any one of a plurality of points of between said first connection point and said first capacitance element, between said first capacitance element and said power supply terminal; between said second connection point and said second capacitance element and between said second capacitance element and said power supply terminal to limit current provided to said quartz oscillator;

wherein a sum of said resistance values of said current limiting resistors lies in a range of from 10Ω to 320Ω.

3. A quartz oscillation circuit having improved stability and performance comprising:

a CMOS inverter;

a quartz oscillator connected between input and output terminals of said CMOS inverter;

a feedback resistor connected between said input and output terminals of said CMOS inverter;

a first capacitance element provided between a connection point of said input terminal of said CMOS inverter and said quartz oscillator and a power supply terminal having a particular potential;

a second capacitance element provided between a connection point of said output terminal of said CMOS inverter and said quartz oscillator and said power supply terminal having a particular potential; and one or more current limiting resistors having resistance values set for stability and startability of the quartz oscillation circuit while ensuring that there is no damage to a quartz crystal of the quartz oscillation circuit, said resistors provided between said connection point of said input terminal and said power supply terminal and between said connection point of said output terminal and said power supply terminal to limit current provided to said quartz oscillator;

wherein a sum of said resistance values of said current limiting resistors lies in a range of from 10Ω to 320Ω.

4. The quartz oscillation circuit of claim 3 wherein at least one of said resistors is provided between said connection point of said output terminal and said second capacitance element.

5. The quartz oscillation circuit of claim 3 wherein a first resistor is connected between said connection point of said input terminal and said first capacitance element and a second resistor is connected between said connection point of said output terminal and said second capacitance element.

6. The quartz oscillation circuit of claim 3 wherein at least one of said resistors is provided between said first capacitance element and said power supply terminal.

7. The quartz oscillation circuit of claim 3 wherein a first resistor is connected between said first capacitance element and said power supply terminal and a second resistor is connected between said second capacitance element and said power supply terminal.

8. The quartz oscillation circuit of claim 1 wherein the value of said resistant values of said current limiting resistors lies in a range from 40Ω to 220Ω.

9. The quartz oscillation circuit of claim 2 wherein the value of said resistant values of said current limiting resistors lies in a range from 40Ω to 220Ω.

10. The quartz oscillation circuit of claim 3 wherein the value of said resistant values of said current limiting resistors lies in a range from 40Ω to 220Ω.

* * * * *